United States Patent [19]
Nakamura

[11] Patent Number: 5,948,162
[45] Date of Patent: Sep. 7, 1999

[54] METHOD FOR FORMING SOI STRUCTURE

[75] Inventor: Tomofumi Nakamura, Kyoto, Japan

[73] Assignee: Rohm Co., Ltd., Kyoto, Japan

[21] Appl. No.: 08/733,069

[22] Filed: Oct. 16, 1996

Related U.S. Application Data

[62] Division of application No. 08/403,984, Mar. 15, 1995, abandoned, which is a continuation of application No. 08/149,144, Nov. 5, 1993, abandoned, which is a continuation of application No. 07/841,941, Feb. 26, 1992, abandoned.

[30] Foreign Application Priority Data

Oct. 24, 1991 [JP] Japan .................................. 3-277496

[51] Int. Cl.$^6$ .................................................. C30B 25/04
[52] U.S. Cl. .................. 117/90; 117/94; 117/97; 117/913; 117/935; 148/33.3
[58] Field of Search .................... 117/935, 90, 97, 117/94, 913; 148/33.3

[56] References Cited

U.S. PATENT DOCUMENTS

| | | | |
|---|---|---|---|
| 3,502,515 | 3/1970 | McMullen et al. | 117/935 |
| 4,507,158 | 3/1985 | Kamins et al. | |
| 4,749,441 | 6/1988 | Christenson et al. | |
| 5,269,876 | 12/1993 | Mitzutani | 117/935 |
| 5,653,802 | 8/1997 | Yamagata | 117/935 |

*Primary Examiner*—Robert Kunemund

[57] ABSTRACT

An epitaxially grown layer having a large area and an uniform thickness is formed on an insulating layer. The surface of a silicon substrate (2) is oxidized to form a silicon dioxide layer (4) acting as insulating layer. The silicon dioxide layer (4) is then provided with an opening (10) by etching with the aid of resist (6). After removing the resist (6), a silicon seed crystal layer (11) is selectively grown in the opening (10). Next, the silicon dioxide layer (4) is subjected to etchback using hydrofluoric acid, so that the side face (14) of the seed crystal layer (11) is emerged. The following epitaxial growth on the basis of the seed crystal layer (11) is allowed sufficient growth in the lateral direction. As a result, an epitaxially grown layer having (16) a large area and an uniform thickness is realized.

3 Claims, 3 Drawing Sheets

METHOD FOR FORMING SOI STRUCTURE

This application is a division of application Ser. No. 08/403,984 filed Mar. 15, 1995, abandoned which is a continuation of application Ser. No. 08/149,144 filed Nov. 5, 1993, abandoned which is a continuation of Ser. No. 07/841,941 filed Feb. 26, 1992, abandoned.

BACKGROUND OF THE INVENTION

1. FIELD OF THE INVENTION

The present invention relates to epitaxial growth by means of the ELO (Epitaxial Lateral Overgrowth) method and, more particularly, to the method for forming the SOI structure which allows an easy control of epitaxial growth.

2. DESCRIPTION OF THE PRIOR ART

There is a way of forming an epitaxially grown layer on an insulating layer in order to make a high-speed device in an integrated circuit. The structure thus formed is called the SOI (Semiconductor On Insulator) structure.

FIG. 1 illustrates the conventional SOI technique using the ELO (Epitaxial Lateral Overgrowth) method ("Lateral Epitaxial Overgrowth of Silicon on $SiO_2$," by D. D. Rathman et. al., JOURNAL OF ELECTRO-CHEMICAL SOCIETY SOLID-STATE SCIENCE AND TECHNOLOGY, October, 1982, p. 2303). First, a silicon dioxide layer 4 is grown on top of a semiconductor substrate 2. Then, resist 6 is applied to the silicon dioxide layer 4, as shown in FIG. 1B. The resist 6 is subjected to exposure and development using a photomask to thereby form an opening 8 (FIG. 1C). Further, the silicon dioxide layer 4 is etched using the resist 6 as a mask to thereby open an opening 10 (FIG. 1D).

This is followed by selective epitaxial growth of silicon from the opening 10 (FIG. 1E), so that an epitaxially grown layer 12 shown in FIG. 1F is formed on the silicon dioxide layer 4.

However, the conventional SOI technique described above has the following problems.

First, this technique includes two directional epitaxial growth, that is in the longitudinal direction until the state of FIG. 1E and, subsequently, in the lateral direction. As a result, the epitaxial growth can not be readily regulated, making it impossible to realize the epitaxially grown layer having large area or sufficient thickness.

Second, the epitaxially grown layer thus formed tends to swell near the opening 10, not allowed to have uniform thickness.

OBJECTS AND SUMMARY OF THE INVENTION

An object of the present invention, therefore, is to overcome the aforementioned problems and provide a method for forming the SOI structure by which a desired epitaxially grown layer is readily obtained.

According to a feature of the invention, there is provided a method of epitaxial growth comprising the steps of:
  forming an insulating layer on a surface of a semiconductor substrate;
  providing the insulating layer with an opening;
  forming a seed crystal layer in the opening;
  removing a certain thickness of insulating layer, the remaining insulating layer being overlaid on the surface of the semiconductor substrate, whereby a side face of the seed crystal layer is emerged; and
  forming an epitaxially grown layer on the insulating layer on the basis of the seed crystal layer.

According to a further feature of the invention, there is provided a semiconductor device manufactured by the method described above.

While the novel features of the invention are set forth in a general fashion, particularly in the appended claims, the invention, both as to organization and content, will be better understood and appreciated, along with other objects and features thereof, from the following detailed description taken in conjunction with the drawings.

DESCRIPTION OF THE PREFERRED EMBODIMENT

In FIG. 2 there is shown a process for forming the SOI structure according to an embodiment of the present invention. First, the surface of a silicon substrate 2 is oxidized so as to form a silicon dioxide layer 4 which acts as insulating layer, as shown in FIG. 2A.

Figure 1A:
FIGS. 1a to 1F are drawings illustrating a method for forming the SOI structure according to the conventional ELO method.
Figure 1B:
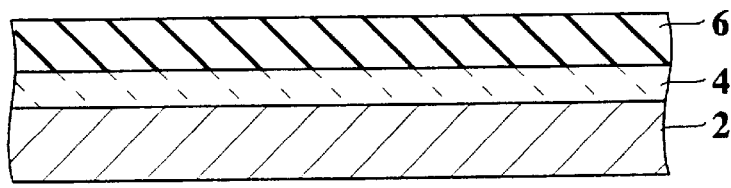
Figure 1C:
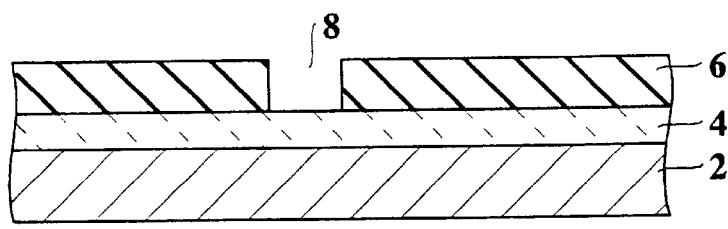
Figure 1D:
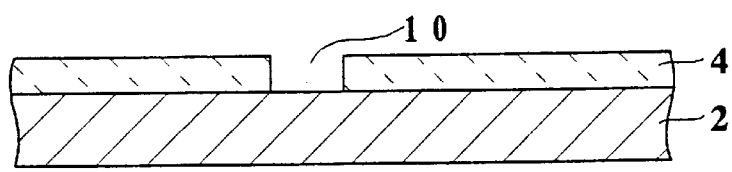
Figure 1E:
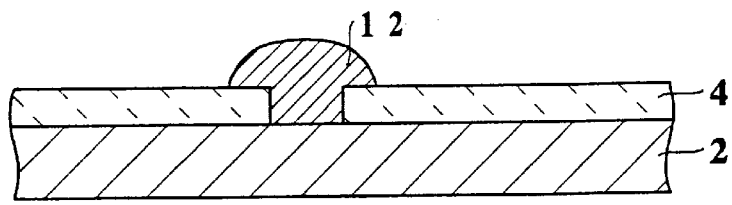
Figure 1F:
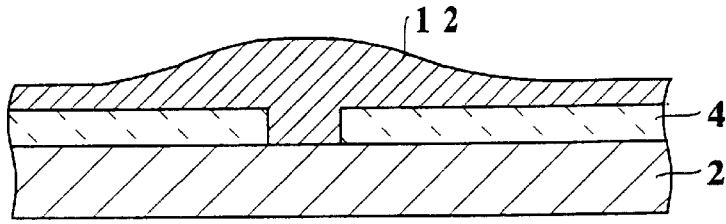
Figure 2A:
FIGS. 2a to 2F are drawings illustrating a method for forming the SOI structure according to an embodiment of the present invention.
Figure 2B:
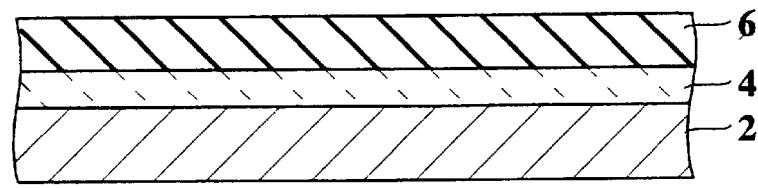
Figure 2C:
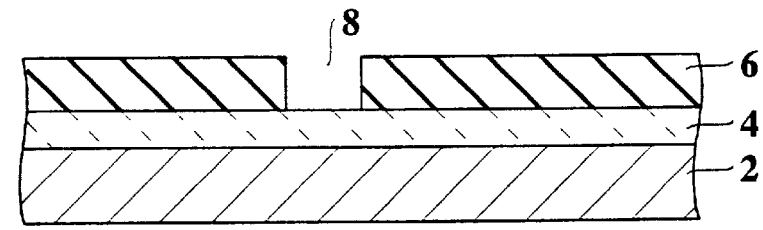

Next, resist 6 is applied to the silicon dioxide layer 4, as shown in FIG. 2B. The resist 6 is then subjected to exposure and development using a photomask to thereby form an opening 8 (FIG. 2C). Further, the silicon dioxide layer 4 is etched using the resist 6 as a mask, so that it is provided with an opening 10. Thereafter the resist 6 is removed.

Figure 2D:
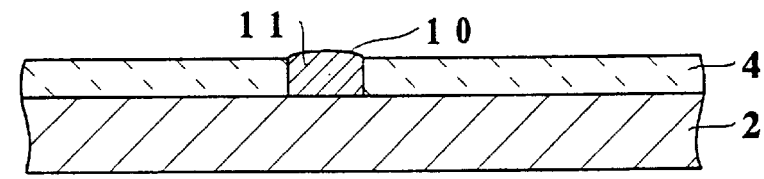

This is followed by selective epitaxial growth of a silicon seed crystal layer 11 from the opening 10. The epitaxial growth is made to stop when the seed crystal layer 11 reaches to almost the same thickness as the opening 10, as shown in FIG. 2D. The thickness of the seed crystal layer 11 may be slightly larger or smaller than that of the opening 10.

Figure 2E:
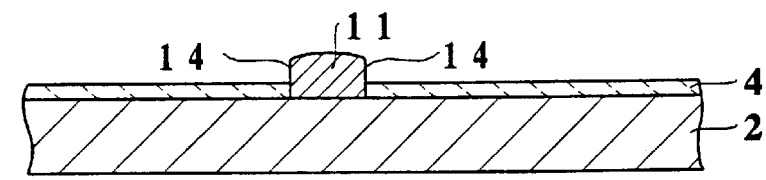
Figure 2F:
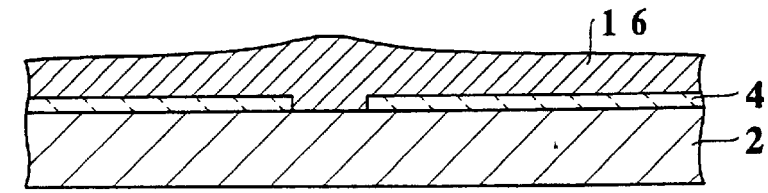

Next, the silicon dioxide layer 4 is subjected to etchback using hydrofluoric acid. This treatment allows a side face 14 of the seed crystal layer 11 to emerge, as shown in FIG. 2E. Subsequently, epitaxial growth is performed on the basis of the seed crystal layer 11. Owing to the side face 14 emerged, the seed crystal layer 11 sufficiently grows in the lateral direction. As a result, an epitaxially grown layer 16 having a large area and an uniform thickness is obtained.

In this process, varying the etchback depth of the silicon dioxide layer 4 enables to control lateral growth of the epitaxially grown layer 16.

In FIG. 3 there is shown a process for forming the SOI structure according to another embodiment of the present invention. First, the surface of a silicon substrate 2 is oxidized so as to form a silicon dioxide layer 4 which acts as insulating layer, as shown in FIG. 3A. Next, resist 6 is applied to the silicon dioxide layer 4, as shown in FIG. 3B. The resist 6 is then subjected to exposure and development using a photomask to thereby form an opening 8 (FIG. 3C). Further, the silicon dioxide layer 4 is etched using the resist 6 as a mask to thereby open an opening 10, and thereafter the resist 6 is removed.

Figure 3A:
FIGS. 3a to 3g are drawing illustrating a method for forming the SOI structure accordings to another embodiment of the present invention.
Figure 3B:
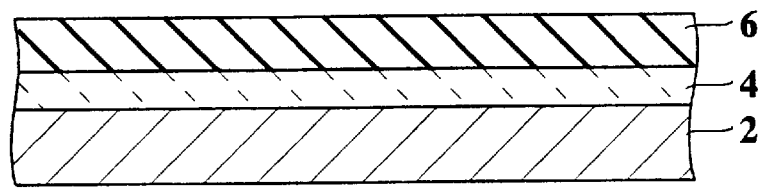
Figure 3C:
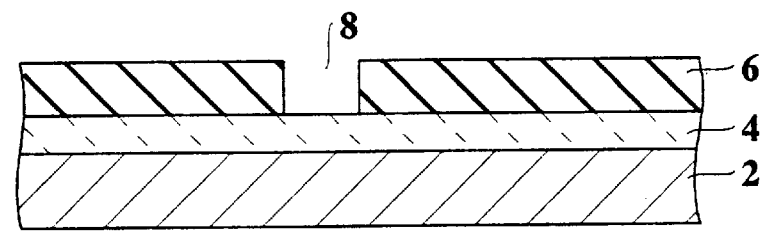
Figure 3D:
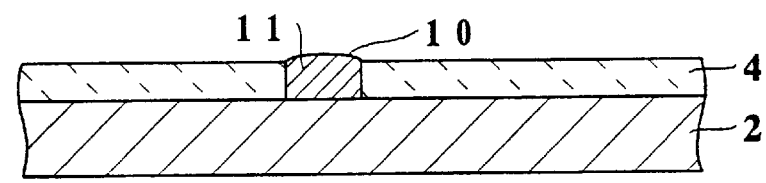
Figure 3E:
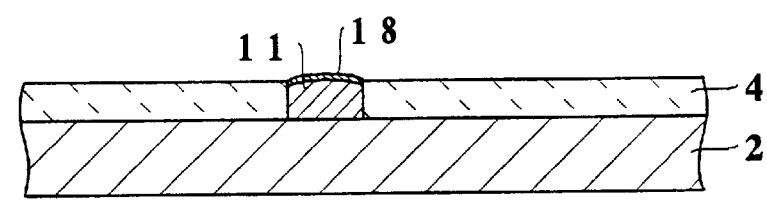

This is followed by selective epitaxial growth of a silicon seed crystal layer 11 from the opening 10. The epitaxial growth is made to stop when the seed crystal layer 11 reaches to almost the same thickness as the opening 10, as shown in FIG. 3D. The thickness of the seed crystal layer 11 may be slightly larger or smaller than that of the opening 10. Further, as shown in FIG. 3E, the surface of the seed crystal layer 11 is nitrified, with the result that a silicon nitride layer 18 which acts as growth blocking layer is formed.

Figure 3F:
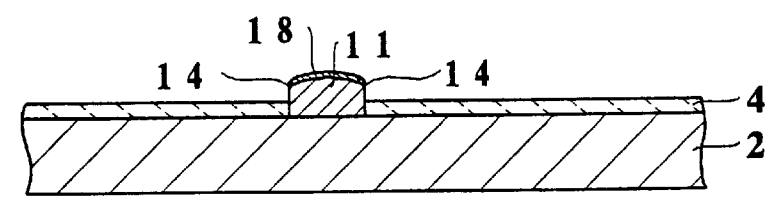
Figure 3G:
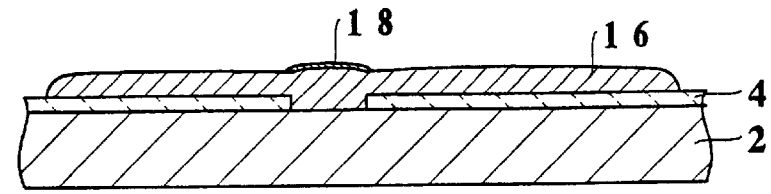

Next, the silicon dioxide layer 4 is subjected to etchback using hydrofluoric acid. This treatment allows a side face 14 of the seed crystal layer 11 to emerge, as shown in FIG. 3F. Subsequently, epitaxial growth is performed from the seed crystal layer 11. Owing to the side face 14 emerged, the seed crystal layer 11 sufficiently grows in the lateral direction. Moreover, the silicon nitride layer 18 formed on the top surface of the seed crystal layer 11 serves to block upward growth. Accordingly, an epitaxially grown layer 16 which is more uniform in thickness-is provided.

In the above embodiment, a silicon nitride layer 18 is used as a growth blocking layer. However, it may be substituted for by a silicon dioxide layer or the like which can prevent the seed crystal layer 11 from growing. In addition, even though silicon is subjected to epitaxial growth in the above embodiment, silicon carbide may be also available for that purpose.

In the method for forming the SOI structure of the present invention, after forming a seed crystal layer, not complete but a certain thickness of insulating layer is removed, the remaining layer still overlaying the surface of the semiconductor substrate, and thereafter epitaxial growth is performed. In this process, lateral growth of the seed crystal layer is controllable by varying the height of a side face emerged. Consequently, it can realize an epitaxially grown layer having a large area and an uniform thickness.

In the method for forming the SOI structure of the present invention, a step of forming a growth blocking layer is established after a step of forming the seed crystal layer and before a step of forming the epitaxially grown layer. Accordingly, it can provide an epitaxially grown layer which is more uniform in thickness.

Although the invention has been described in its preferred form with a certain degree of particularity, it is understood that the present disclosure of the preferred form has been changed in the details of its construction and any combination and arrangement of parts may be resorted to without departing from the spirit and the scope of the invention as hereinafter claimed.

What is claimed is:

1. A method of epitaxial growth, comprising the steps of:
   forming an insulating layer of a particular thickness on a surface of a semiconductor substrate;
   providing the insulating layer with an opening;
   forming in the opening a seed crystal layer having an upper surface;
   reducing the thickness of at least a portion of the insulating layer to expose a portion of a side face of the seed crystal layer; and
   forming an epitaxially grown layer on the insulating layer originating from the seed crystal layer such that an upper surface of the epitaxial layer is substantially at a common level with the upper surface of the seed crystal layer.

2. A method of epitaxial growth comprising the steps of:
   forming an insulating layer of a particular thickness on a surface of a semiconductor substrate;
   providing the insulating layer with an opening;
   forming in the opening a seed crystal layer having an upper surface;
   reducing the thickness of at least a portion of the insulating layer to expose a portion of a side face of the seed crystal layer;
   forming an epitaxially grown layer on the insulating layer originating from the seed crystal layer; and
   forming a growth blocking layer on a top surface of the seed crystal layer after the step of forming the seed crystal layer and before the step of forming the epitaxially grown layer.

3. An intermediate semiconductor device structure comprising:
   an insulating layer having a first thickness formed on a semiconductor substrate and having a through opening, said opening having a width and being surrounded by a continuous portion of said insulating layer which has a width of greater than about twice the width of said opening;
   an epitaxially grown seed crystal layer in said opening having a height greater than the first thickness of said insulating layer and having an upper surface;
   an epitaxially crown blocking layer on the upper surface of said seed crystal layer; and
   an epitaxially grown layer on said insulating layer being of a relatively common thickness and having an upper surface substantially at a common level with the upper surface of the seed crystal layer.

* * * * *